United States Patent
Takayama et al.

(10) Patent No.: US 9,823,777 B2
(45) Date of Patent: Nov. 21, 2017

(54) TOUCH PANEL DRIVING DEVICE, DISPLAY DEVICE, MOBILE TERMINAL, COMPUTER-READABLE RECORDING MEDIUM HAVING TOUCH PANEL DRIVER PROGRAM RECORDED THEREON, AND TOUCH PANEL DRIVING METHOD

(71) Applicant: Sharp Kabushiki Kaisha, Osaka-shi, Osaka (JP)

(72) Inventors: Kazuya Takayama, Osaka (JP); Kenji Maeda, Osaka (JP); Masayuki Natsumi, Osaka (JP); Tatsuo Watanabe, Osaka (JP); Yuichi Sato, Osaka (JP); Tetsuya Umekida, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 14/421,461

(22) PCT Filed: Aug. 12, 2013

(86) PCT No.: PCT/JP2013/071825
§ 371 (c)(1),
(2) Date: Feb. 13, 2015

(87) PCT Pub. No.: WO2014/030572
PCT Pub. Date: Feb. 27, 2014

(65) Prior Publication Data
US 2015/0185956 A1    Jul. 2, 2015

(30) Foreign Application Priority Data

Aug. 23, 2012  (JP) ................................ 2012-184548

(51) Int. Cl.
G06F 3/041 (2006.01)
G06F 3/044 (2006.01)
(Continued)

(52) U.S. Cl.
CPC ............ *G06F 3/0418* (2013.01); *G06F 3/044* (2013.01); *G02F 1/13338* (2013.01); *G06F 1/3262* (2013.01); *H01L 27/323* (2013.01)

(58) Field of Classification Search
CPC ...... G06F 3/0418; G06F 3/044; G06F 1/3262; G02F 1/13338; H01L 27/323
See application file for complete search history.

(56) References Cited

U.S. PATENT DOCUMENTS

2007/0257890 A1   11/2007  Hotelling et al.
2010/0079401 A1*   4/2010  Staton ................ G06F 3/044
                                                         345/174
(Continued)

FOREIGN PATENT DOCUMENTS

JP   2011-008724 A   1/2011
JP   2011-013996 A   1/2011
(Continued)

*Primary Examiner* — William Boddie
*Assistant Examiner* — Saifeldin Elnafia
(74) *Attorney, Agent, or Firm* — Keating & Bennett, LLP (57) ABSTRACT

A touch panel driving device includes: a noise detection section (43) that detects the presence or absence of at least external noise of an input operation performed on a touch panel (30); and a liquid crystal drive parameter setting section (51) that, in a case where the presence of external noise has been detected by the noise detection section (43), executes a process for reducing the external noise by adjusting a cycle or duration of a 1H period.

7 Claims, 7 Drawing Sheets

(51) Int. Cl.
  *G06F 1/32*    (2006.01)
  *G02F 1/1333*  (2006.01)
  *H01L 27/32*   (2006.01)

(56)          References Cited

U.S. PATENT DOCUMENTS

| | | |
|---|---|---|
| 2010/0214259 A1 | 8/2010 | Philipp et al. |
| 2010/0328257 A1 | 12/2010 | Noguchi et al. |
| 2011/0115729 A1* | 5/2011 | Kremin ............ G06F 3/0418 345/173 |
| 2012/0044180 A1 | 2/2012 | Matsui et al. |
| 2012/0049869 A1* | 3/2012 | Kremin ............ G06F 3/0412 324/679 |
| 2012/0056834 A1* | 3/2012 | Kim ............ G06F 3/0418 345/173 |
| 2012/0262390 A1* | 10/2012 | Kida ............ G06F 3/041 345/173 |

FOREIGN PATENT DOCUMENTS

| | | |
|---|---|---|
| JP | 2012-043394 A | 3/2012 |
| KR | 10-2008-0041799 A | 5/2008 |

\* cited by examiner

TOUCH PANEL DRIVING DEVICE, DISPLAY DEVICE, MOBILE TERMINAL, COMPUTER-READABLE RECORDING MEDIUM HAVING TOUCH PANEL DRIVER PROGRAM RECORDED THEREON, AND TOUCH PANEL DRIVING METHOD

TECHNICAL FIELD

The present invention relates to a touch panel driving device that controls driving of a touch panel by transmitting a driving signal, a display device including the touch panel driving device, a portable terminal including the display device, a touch panel driver program, a computer-readable storage medium containing the touch panel driving program, and a touch panel driving method.

BACKGROUND ART

Attention has recently been drawn to display devices mounted with GUIs (Graphical User Interfaces). The GUIs are achieved by incorporating input devices called touch panels into display devices such as liquid crystal display devices. The GUIs serve as alternatives to common mechanical buttons. The GUIs enable information input by causing the display devices to display various virtual keys.

There are several types of touch panel such as an optical type and a resistive type. Especially in portable terminals, capacitive touch panels are commonly used, as they have comparatively simple structures and consume less electric power.

However, a capacitive touch panel had such a problem that there is a possibility that noise attributed to an inverter fluorescent light, AM (amplitude modulation) waves, an AC (alternating current) power source, or the like (such noise being hereinafter referred to as "external noise") may be transmitted to the touch panel to cause a malfunction.

This malfunction is attributed to the fact that a capacitive touch panel cannot distinguish between a signal for indicating the presence or absence of a touch that is generated when a user touches the touch panel with a finger or the like or moves a finger or the like toward the touch panel (such a signal being hereinafter referred to as "touch signal") and external noise. Usually, a capacitive touch panel has its transmitting circuit output a signal for driving the touch panel (such a signal being hereinafter referred to as "driving signal"), has its receiving circuit perform detection at a timing when the driving signal rises or falls, and subjects the received signal to A/D (alternating current/direct current) conversion. If a cycle of this detection and a cycle of external noise interfere with each other, the touch panel may become unable to distinguish between the touch signal that is supposed to be detected and the external noise.

In order to solve this problem, Patent Literature 1 proposes a method for detecting a touch signal synchronized with a driving signal for driving a capacitive touch panel, in which method a touch signal is detected under a condition that is free of the influence of external noise, the condition being selected using a plurality of signals of different frequencies. In this method, the receiving circuit detects a touch signal by using a plurality of driving signals of different frequencies to select, from among these driving signals, a signal of a frequency that is free of the influence of external noise.

Next, in Patent Literature 2, correction data corresponding to a detection timing indicated by a detection timing signal is obtained from a correction data table in synchronization with a display timing signal, and a correction circuit corrects detected data by using the correction data thus obtained.

Further, in Patent Literature 3, a drive control circuit controls the driving signal to be applied so that a detected signal is a polarity alternate signal containing a peak-to-peak asymmetric signal component attributed to the presence of an external object nearby.

Furthermore, in Patent Literature 4, the moving average of contact information is calculated for even numbers of successive frames, whereby calculated contact information in each of the frames can be obtained.

CITATION LIST

Patent Literature 1
United States Patent Application Publication No. 2007/0257890 A (Publication Date: Nov. 8, 2007)
Patent Literature 2
Japanese Patent Application Publication, Tokukai, No. 2011-13996 A (Publication Date: Jan. 20, 2011)
Patent Literature 3
Japanese Patent Application Publication, Tokukai, No. 2011-8724 A (Publication Date: Jan. 13, 2011)
Patent Literature 4
Japanese Patent Application Publication, Tokuaki, No. 2012-43394 A (Publication Date: Mar. 1, 2012)

SUMMARY OF INVENTION

Technical Problem

However, the conventional technologies have such a problem that liquid crystal driving and touch panel driving are synchronized with each other and in a case where a cycle of external noise interferes with a cycle of a horizontal synchronization period (hereinafter referred to simply as "1H period") of a driving signal for touch panel driving, there is a possibility that a detection timing may occur when it is difficult to distinguish between the external noise and a touch signal.

For example, in the technology of Patent Literature 1, a cycle or duration of a 1H period is fixed, although a plurality of driving signals of different frequencies are used. Therefore, in a case where the cycle of external noise interferes with the cycle of the 1H period, there is a possibility that a detection timing may occur when it is difficult to distinguish between the external noise and a touch signal.

Similarly, none of Patent Literatures 2 to 4 describes or suggests such a problem that in such a case where the cycle of external noise interferes with the cycle of a 1H period, there is a possibility that it may become difficult to distinguish between the external noise and a touch signal, nor does any of them describe or suggest a solution to this problem, either.

The present invention has been made in view of the conventional problem, and it is an object of the present invention to provide, for example, a touch panel driving device that makes it possible to surely detect a touch signal even in a case where the cycle of external noise interferes with the cycle of a 1H period.

Solution to Problem

In order to solve the foregoing problems, a touch panel driving device according to an aspect of the present invention includes: a drive control section that controls driving of a touch panel by transmitting a driving signal; a signal detection section that detects a plurality of output signals that are outputted from coordinates of the touch panel, respectively; a noise detection section that detects, in accordance with the magnitude of at least one of the plurality of output signals detected by the signal detection section, the presence or absence of at least external noise of an input operation performed on the touch panel; and a noise reduction section that, in a case where the presence of external noise has been detected by the noise detection section, executes a process for reducing the external noise by adjusting a cycle or duration of a horizontal synchronization period of the driving signal.

In order to solve the foregoing problems, a touch panel driving method according to an aspect of the present invention is a touch panel driving method for controlling driving of a touch panel by transmitting a driving signal, including: a signal detecting step of detecting a plurality of output signals that are outputted from coordinates of the touch panel, respectively; a noise detecting step of detecting, in accordance with the magnitude of at least one of the plurality of output signals detected in the signal detecting step, the presence or absence of at least external noise of an input operation performed on the touch panel; and a noise reducing step of, in a case where the presence of external noise has been detected in the noise detecting step, executing a process for reducing the external noise by adjusting a cycle or duration of a horizontal synchronization period of the driving signal.

Advantageous Effects of Invention

An aspect of the invention makes it possible to surely detect a touch signal even in a case where the cycle of external noise interferes with the cycle of a 1H period.

Additional objects, features, and strengths of the present invention will be made clear by the description below. Further, the advantages of the present invention will be evident from the following explanation in reference to the drawings.

DESCRIPTION OF EMBODIMENTS

An embodiment of the present invention is described below with reference to FIG. 1 through 7. Configurations other than those which are described in particular sections below may be omitted from the description as needed but, in cases where they are described in other sections, the configurations are identical. Further, for convenience of explanation, members having the same functions as those described in the preceding sections are given the same reference signs, and as such, are omitted from the description as needed.

[Portable Terminal Device 1]

Figure 1:
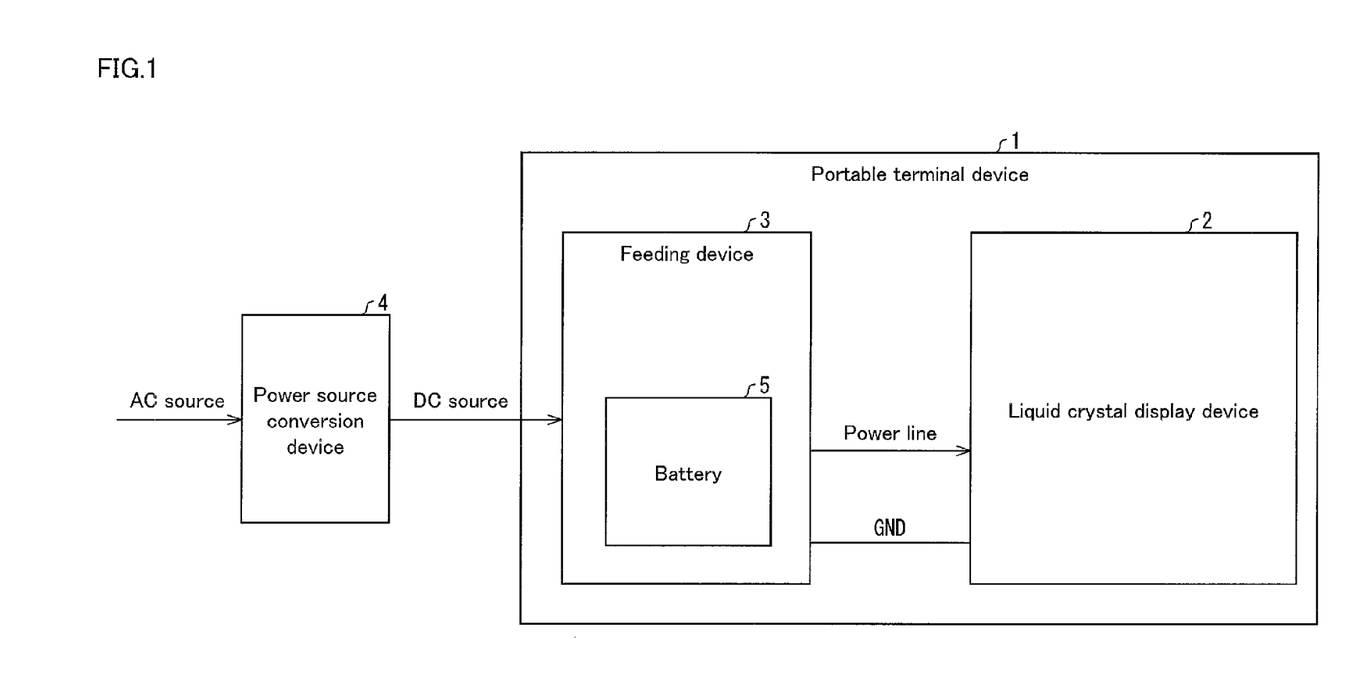
FIG. 1 is a block diagram showing a configuration of a portable terminal device according to an embodiment of the present invention.

First, a configuration of a portable terminal device (portable terminal) 1 according to an embodiment of the present invention is described with reference to FIG. 1. FIG. 1 is a block diagram showing the configuration of the portable terminal device 1.

The portable terminal device 1 of the present embodiment is intended to represent a system in which a touch panel sensor (TP sensor) and an LCD (liquid crystal display) glass are joined on top of each other and a touch panel controller (TP controller) 40 and a liquid crystal driver 12 are controlled from a host controller 50. The touch panel controller 40 drives a TP sensor in synchronization with a Hsync signal (horizontal synchronizing signal HS) that is outputted from the liquid crystal driver 12.

As shown in FIG. 1, the portable terminal device 1 includes a liquid crystal display device (display device) 2 and a feeding device 3.

(Feeding Device 3, Power Source Conversion Device 4)

A battery 5 in the feeding device 3 can be charged by connecting a power source conversion device 4 (AC charger) to the portable terminal device 1.

Possible examples of the battery 5 include lithium-ion batteries, lithium polymer batteries, ultrasmall fuel cells (DMFC; direct methanol fuel cells), zinc air batteries, light-air secondary batteries, proton polymer batteries, organic radical batteries, etc.

The connection of the power source conversion device 4 to the portable terminal device 1 may cause the drive frequency of the touch panel 30 and the frequency of switching noise of the power source conversion device 4 to interfere with each other to adversely affect the sensitivity of the touch panel.

Interference between a cycle of the drive frequency and a cycle of the drive frequency of the touch panel 30 may possibly be avoided by changing the drive frequency of the touch panel. However, there has conventionally been such a problem that since, in a state where liquid crystal driving and touch panel driving are synchronized with each other, a horizontal synchronization period (hereinafter referred to simply as "1H period) of a driving signal of the touch panel 30 is fixed, this limitation of the 1H period imposed restrictions on the switchable range of drive frequencies of the touch panel 30.

The following details each of the components of the portable terminal device 1 according to an embodiment of the present invention devised to solve such a problem.

[Liquid Crystal Display Device 2]

Figure 2:
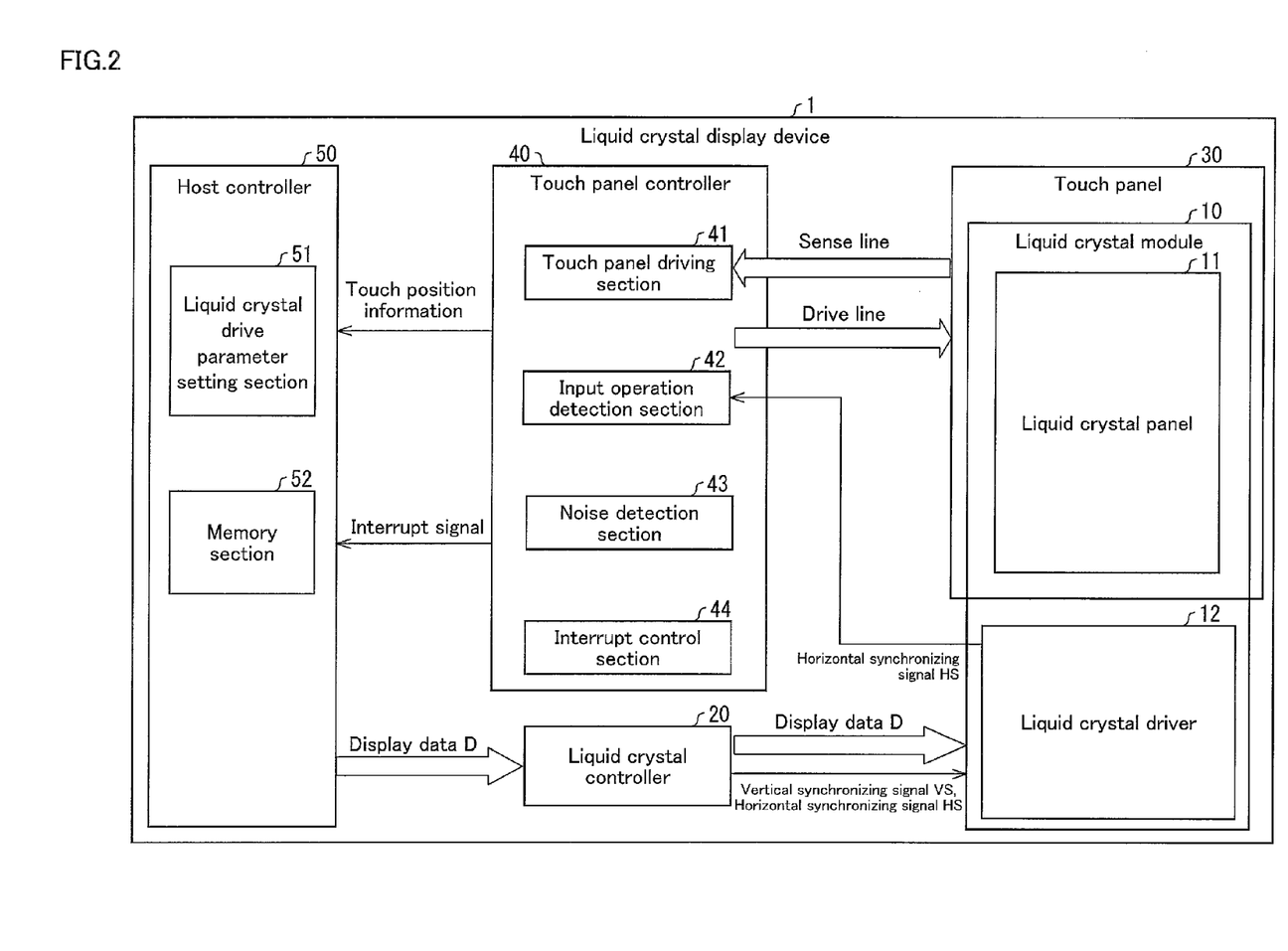
FIG. 2 is a block diagram showing a configuration of a liquid crystal display device of the portable terminal device.

FIG. 2 is a block diagram showing a configuration of the liquid crystal display device 2.

As shown in FIG. 2, the liquid crystal display device 2 includes a liquid crystal module 10, a liquid crystal panel 11, a liquid crystal driver 12, a liquid crystal controller 20, the touch panel 30, a touch panel controller (touch panel driving device) 40, and a host controller 50.

(Liquid Crystal Module 10)

The liquid crystal module 10 includes the liquid crystal panel 11 and the liquid crystal driver 12.

(Liquid Crystal Panel 11)

The liquid crystal panel 11 includes a plurality of gate lines, a plurality of source lines, and a plurality of display pixels. The plurality of gate lines run parallel to one another at regular intervals. The plurality of source lines, which extend in a direction orthogonal to the gate lines, run parallel to one another at regular intervals. The display pixels are provided at the intersections between the gate lines and the source lines, respectively. To each of the display pixels, a TFT (thin film translator) serving as a switching element is connected.

The present embodiment is described by taking an LCD (liquid crystal display) as an example of a display panel. However, the present invention can be applied in a form other than an LCD. For example, an organic EL (electroluminescence) display or the like may be employed.

(Liquid Crystal Driver 12)

The liquid crystal driver 12 includes a gate driver that drives the gate lines and a source driver that drives the source lines. The gate driver outputs a scanning signal to each of the gate lines in sequence to turn on the TFT. The source driver outputs a gradation display voltage (drive voltage) to each of the source lines.

When the TFT is on, the voltage from the gate line is applied to the display pixel, and electric charge is stored. This causes the light transmittance of liquid crystals to vary according to the drive voltage, whereby the liquid crystal panel 11 displays an image.

As in the liquid crystal display device 2 of the present embodiment, a liquid crystal display device 2 including a touch panel 30 as an input device has such another problem that noise caused by a display operation performed by the liquid crystal panel 11 may cause the touch panel 30 to malfunction. For this reason, for example, as a measure to prevent a flicker, an image sticking phenomenon, or the like, it is preferable that in a liquid crystal display device 2 including a touch panel 30, the polarity of the driving signal that acts on the liquid crystal panel 11 be reversed every frame cycle or every line scanning cycle. In most of these cases, the polarity of a common voltage set at a certain voltage value is reversed every such cycle. Noise is generated at a timing when the polarity of the common voltage is reversed. This noise may be superposed onto the drive voltage of the touch panel 30 to cause the touch panel 30 to degrade in sensitivity or erroneously detect a touch position.

For this reason, it is preferable that by synchronizing the timing of liquid crystal driving and that of touch panel driving with each other, the touch panel be driven off the timing of noise that is generated by reversal of the polarity during a horizontal line drive period (hereinafter, 1 horizontal period=1H period).

For example, for prevention of a flicker and an image sticking phenomenon, the liquid crystal panel 11 is driven on AC, and the polarity of the drive voltage that is applied to the display pixel is reversed every single or plural gate line(s), every single or plural source line(s), and every single or plural frame(s) (dot inversion driving system). Alternatively, a system may be employed in which reversal occurs every single or plural source line(s) and every single or plural frame(s) (line inversion drive system).

(Liquid Crystal Controller 20)

The liquid crystal controller 20 receives display data D from the host controller 50. Upon receiving the display data D, the controller 20 supplies the display data D to the liquid crystal driver 12, together with signals for display control of the liquid crystal panel 11, such as a Vsync (vertical synchronizing signal VS) and a horizontal synchronizing signal HS. This causes the timing of driving of the liquid crystal display to be controlled, whereby an image represented by the display data D is displayed on the liquid crystal panel 11.

Further, the aforementioned liquid crystal driver 12 supplies the after-mentioned horizontal synchronizing signal HS to the touch panel controller 40. In order to reduce the effect of noise that is generated by reversal of the polarity of a common electrode of the liquid crystal panel 11 on the touch panel 30, the touch panel controller 40 uses this horizontal synchronizing signal HS to drive the touch panel 30 at a timing when no such polarity reversal occurs.

(Touch Panel 30)

The touch panel 30 is an input device provided for a touch operation to be performed on the display screen of the liquid crystal panel 11. When a touch operation is performed on the touch panel 30, the touch panel 30 outputs a signal corresponding to the touch position. Any type of touch panel can be used as the touch panel 30, but in the present embodiment, a capacitive touch panel is used.

Figure 3:
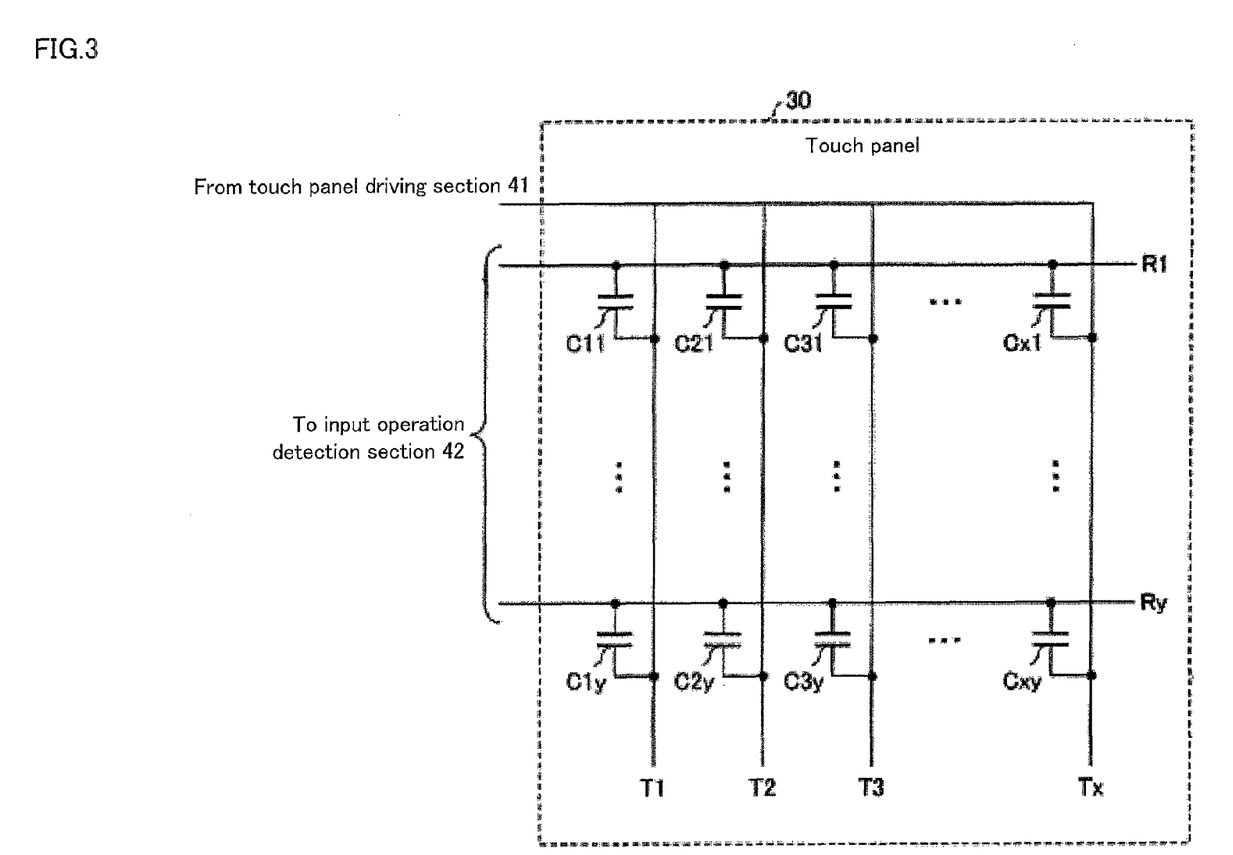
FIG. 3 is a circuit diagram specifically showing a configuration of a touch panel of the liquid crystal display device.

FIG. 3 is a diagram specifically showing a configuration of the touch panel 30. The touch panel 30 includes x drive lines T1 to Tx, y sense lines R1 to Ry, and capacitors C11 to Cxy. The drive lines T1 to Tx and the sense lines R1 to Ry are arranged in a reticular pattern (i.e. in a matrix manner), and the capacitor C11 to Cxy are formed at the intersections between the drive lines T1 to Tx and the sense lines R1 to Ry, respectively.

(Touch Panel Controller 40)

Further, the drive lines T1 to Tx and the sense lines R1 to Ry are connected to the touch panel controller 40. The touch panel controller 40 (and/or the host controller 50) corresponds to an embodiment of a touch panel driving device of the present invention and, as shown in FIG. 2, includes a touch panel driving section (drive control section) 41, an input operation detection section (signal detection section) 42, a noise detection section (noise detection section) 43, and an interrupt control section (interrupt control section) 44.

The touch panel driving section 41 applies voltage signals to the drive lines T1 to Tx of the touch panel 30 in sequence. This causes electric charge to be stored in the capacitors C11 to Cxy. When an object comes into contact with the touch panel 30, the capacitance of the capacitor corresponding to the position of contact changes, and accordingly, the current value of the sense line connected to the capacitor changes. The input operation detection section 42 of the touch panel controller 40 can detect a touch position, a touch area, or the like on the basis of output signals from the sense lines R1 to Ry.

(Noise Detection Section 43)

In order to prevent the input operation detection section 42 from being affected by noise, the noise detection section 43 functions to detect the touch panel controller 40 being under the influence of noise. Examples of noise are switching noise generated from a power source IC (integrated circuit) in the power source conversion device 4 externally connected to the portable terminal device 1 and external noise caused by an inverter fluorescent light or by AM waves.

(Interrupt Control Section 44)

The interrupt control section 44 is configured to, upon detection of external noise by the noise detection section 43, output an interrupt signal (cause of interrupt: external noise detection) to notify the host controller 50 of the external noise detection. How to detect external noise will be described later.

This configuration makes it possible to separately provide a section that executes a process for reducing external noise (e.g. the host controller 50) and a section that detects external noise (e.g. the touch panel controller 30), thus making it possible, for example, to reduce the information processing cost and device cost on the touch panel controller 30 as compared with a case where the touch panel controller 30 is provided with both the section that executes a process for reducing external noise and the section that detects external noise.

Modification 1 of Operation of the Interruption Control Section 44

Further, the interrupt control section 44 may be configured to determine, in accordance with the remaining amount of electricity that the feeding device 3 can feed, whether or not to transmit the interrupt signal to the host controller 50.

This configuration makes it possible for example to, in a case where the remaining amount of electricity that the feeding device 3 can feed (i.e. the remaining battery level of the battery 5) is small, cause the interrupt control section 44 not to transmit an interrupt signal to the host controller 50, thus making it possible to reduce power consumption and therefore extend the length of time for which the portable terminal device 1 can operate.

Modification 2 of Operation of the Interrupt Control Section 44

The interrupt control section 44 may be configured to adjust, in accordance with the remaining amount of electricity that the feeding device 3 can feed, the frequency at which the interrupt control section 44 transmits the interrupt signal to the host controller 50. For example, the frequency of transmission of the interrupt signal can be reduced one for two.

The interrupt control section 44 thus configured increases the frequency of transmission of the interrupt signal to the host controller 50 when the remaining amount of electricity that the feeding device 3 can feed (i.e. the remaining battery level of the battery 5) is large (in such a manner, however, that the frequency does not exceed the frequency of detection of external noise by the noise detection section 43), and on the other hand, decreases the frequency of transmission of the interrupt signal when the remaining amount of electricity that the feeding device 3 can feed is small. This makes it possible to keep a good balance between external noise reduction and power consumption reduction.

Figure 7:
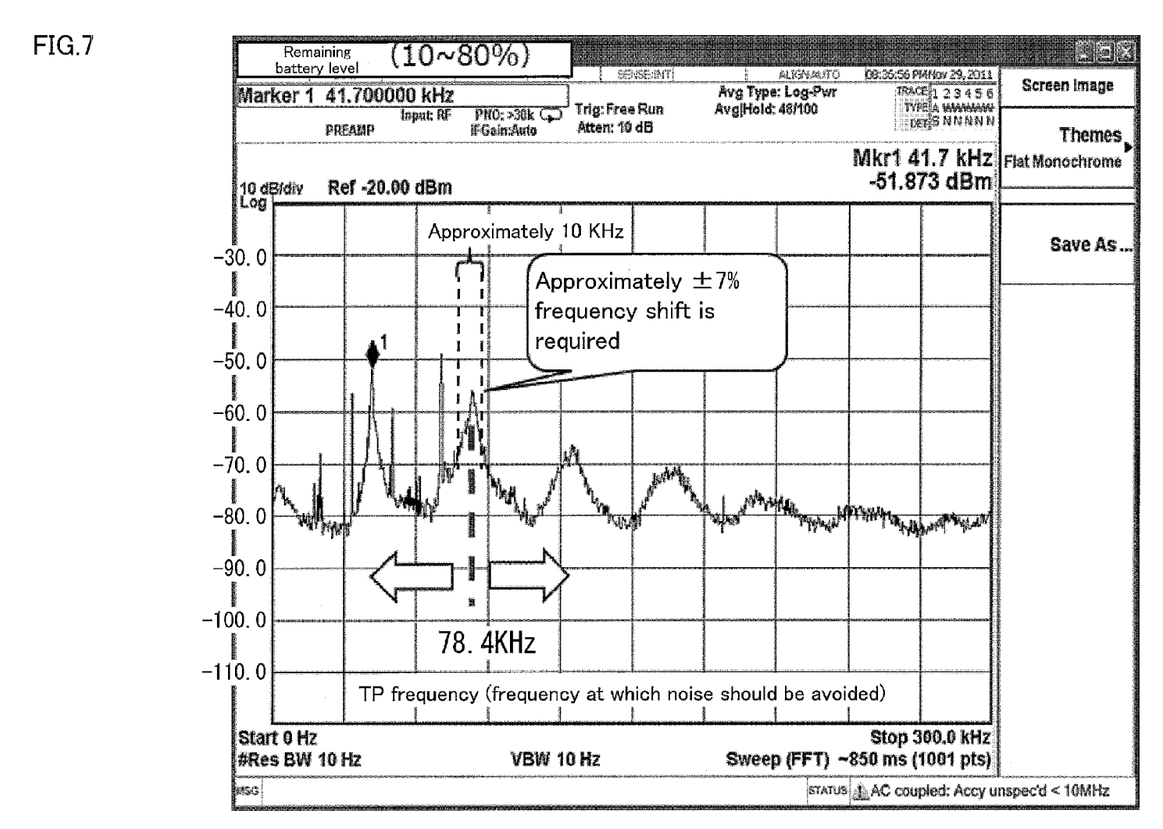
FIG. 7 is a graph showing an example of a frequency distribution of external noise generated when a power source conversion device (AC charger) is connected to the portable terminal device.

Further, the feed circuit operates, for example, at a constant current when the remaining amount of electricity that can be fed (i.e. the remaining battery level) becomes smaller. Since the switching (SW) frequency of the power source circuit is constant in a constant current state, the way spurious noise appears (for example, as shown in FIG. 7) hardly changes.

(Host Controller 50)

Upon receiving an interrupt signal indicating external noise detection, the host controller 50 causes a liquid crystal drive parameter setting section 51 to change a liquid crystal drive parameter. How to change the liquid crystal drive parameter will be described in detail later.

(Details of the Touch Panel Controller 40)

Next, a configuration of the touch panel controller 40 is described in detail with reference to FIGS. 4 and 5.

Figure 4:
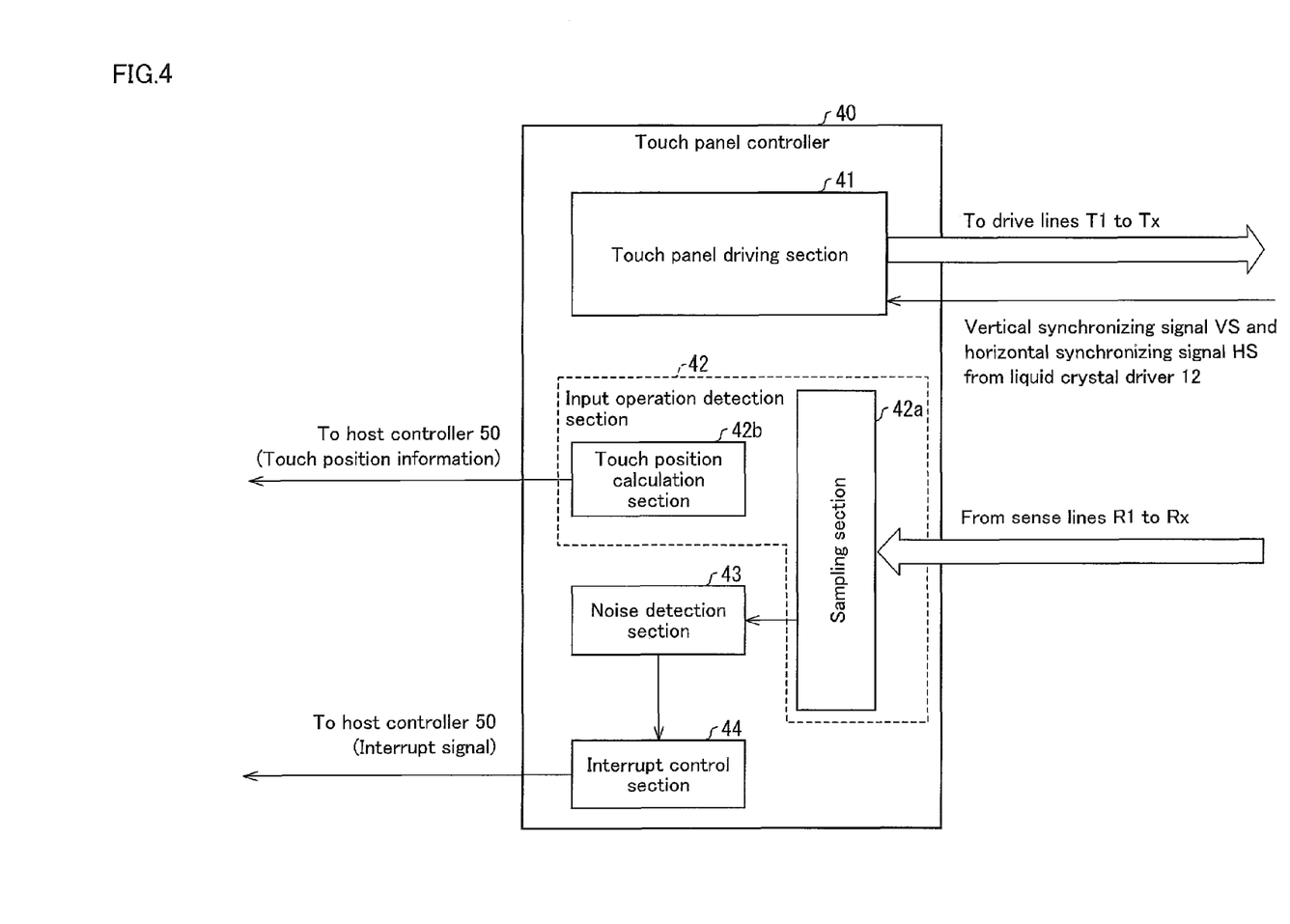
FIG. 4 is a block diagram showing a configuration of a touch panel controller of the liquid crystal display device.

FIG. 4 is a block diagram showing a configuration of the touch panel controller 40.

As shown in FIG. 4, the input operation detection section 42 includes a sampling section 42a and a touch position calculation section 42b.

(Touch Panel Driving Section 41)

As described above, the touch panel driving section 41 is connected to the drive lines T1 to Tx of the touch panel 30, and drives the drive lines T1 to Tx in sequence.

(Input Operation Detection Section 42)

The input operation detection section 42 includes the sampling section 42a and the touch position calculation section 42b. The sampling section 42a is connected to the sense lines R1 to Ry of the touch panel 30, samples output signals from the sense lines R1 to Ry (at coordinates) in sequence, and inputs the data thus sampled to the noise detection section 43.

(Details of how to Detect Noise)

Next, how the noise detection section 43 detects external noise is described. As described above, the sampling section 42a samples a plurality of output signals from the sense lines R1 to Ry in sequence every report, and calculates the capacitance at each intersection in numerical form.

Figure 5:
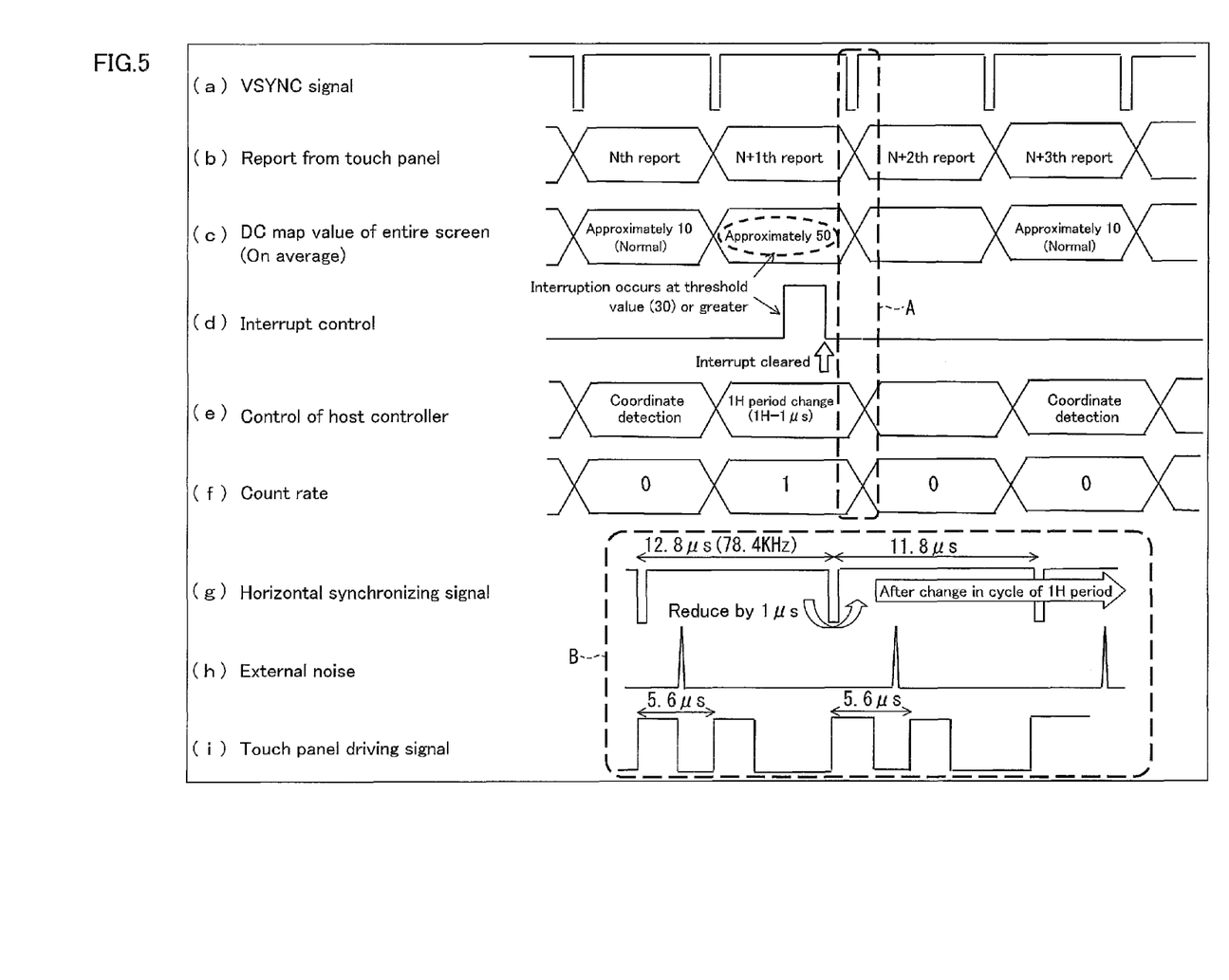
FIG. 5 is a timing chart for explaining the flow of a process for reducing external noise.

FIG. 5 is a timing chart for explaining the flow of a process for reducing external noise. (a) through (k) of FIG. 5 show "Vsync SIGNAL", "REPORT FROM TOUCH PANEL 30", "DC MAP VALUE OF ENTIRE SCREEN(ON AVERAGE)", "INTERRUPT CONTROL", "CONTROL OF HOST CONTROLLER 50", "COUNT VALUE", "HORIZONTAL SYNCHRONIZING SIGNAL", "EXTERNAL NOISE", and "TOUCH PANEL DRIVING SIGNAL", respectively.

The present inventors discovered that the magnitude of at least one of the plurality of output signals that are under the influence of external noise (at least one of the plurality of output signals being hereinafter referred to simply as "output signal") tends to be greater than that of a normal output signal that is free of the influence of external noise. That is, if the magnitude of an output signal detected is greater than that of a normal output signal, it is highly likely that the output signal detected is under the influence of external noise, and if the magnitude of an output signal detected is as great as that of a normal output signal, it is highly likely that the output signal detected is free of the influence of external noise. Therefore, the presence or absence of external noise can be detected by detecting the magnitude of an output signal.

There are two possible cases of "in accordance with the magnitude of at least one of the plurality of output signals", namely "in accordance with one output signal" and "in accordance with two or more output signals". A possible example of the case "in accordance with one output signal" is a case where the median of the plurality of output signals is calculated. On the other hand, a possible example of the case "in accordance with a plurality of output signals" is a case where the average value or deviation value of the plurality of output signals is calculated.

Further, the "presence or absence of external noise" can be determined, for example, depending on whether or not a value such as the median, the average value, or the deviation value exceeds a predetermined threshold value. It should be noted that the value such as the median, the average value, or the deviation value is utilized to avoid erroneous detection.

In the example shown in FIG. 5, the "DC map value of the entire screen (on average)" corresponds to the capacitance, and shows a case where the "DC map value of the entire screen" is adopted as the magnitude of at least one of the plurality of output signals. In the example shown in FIG. 5, assuming that the capacitance under normal conditions free of the influence of external noise is 10, the capacitance under the influence of external noise is 50. As seen from the above, the magnitude of the "DC map value of the entire screen" under the influence of external noise tends to be greater than that of a normal "DC map value of the entire screen" that is free of the influence of external noise.

In the present embodiment, the threshold value is set in advance (in this example, 30), and if the "DC map value of the entire screen (on average)" is 30 or greater, the noise detection section 43 determines that external noise is present, and the interrupt control section 44 outputs an interrupt signal (cause of interrupt: external noise detection) to the host controller 50. On the other hand, if the "DC map value of the entire screen (on average)" is less than 30, the noise detection section 43 determines that external noise is not present, and the interrupt control section 44 does not output an interrupt signal to the host controller 50.

(Details of how to Reduce Noise)

It should be noted here that even in such a case where the frequency of external noise interferes with the frequency of a horizontal synchronization period (hereinafter referred to simply as "1H period") of a driving signal of the touch panel, adjusting the cycle or duration of the horizontal synchronization period of the driving signal makes it possible to suppress the interference of cycle between external noise and the 1H period (more specifically, to avoid the peak frequency of external noise), thus making it possible to reduce external noise. A reason for this is the following characteristics: When external noise is inputted to a receiving circuit (not illustrated) of the touch panel 30, the received signal changes according to the cycle of detection, but in the case of a touch signal, the received signal does not change according to the cycle of detection.

For this reason, the host controller 50 of the present embodiment is configured to, upon receiving an interrupt signal (cause of interrupt: external noise detection), cause the liquid crystal drive parameter setting section 51 to change the cycle or duration of the 1H period, i.e. a liquid crystal drive parameter, so as to change the frequency of the touch panel driving signal. This makes it possible to surely detect a touch signal even in such a case where the cycle of external noise interferes with the cycle of the 1H period.

Next, the noise detection section 43 may identify the cycle of external noise such as the one shown in FIG. 7, and the liquid crystal drive parameter setting section 51 may adjust the cycle or duration of the 1H period in accordance with the identified cycle of external noise in such a manner that a predetermined amount or more of external noise is not inputted when the input operation detection section 42 detects a plurality of output signals.

This configuration will not greatly change the cycle or duration of the 1H period more than necessary. Therefore, this configuration makes it possible, for example, to avoid a situation where a change in the cycle or duration of the 1H period causes the frame rate of display to be less than 60 Hz. More specifically, as shown in FIG. 5, the frequency can be shifted by 8.5% (6.6 kHz) by causing the 1H period to decrease by 1 µs from the default value of 12.8 µs (78.4 kHz) to 11.8 µs. It is intended here to keep the frame rate of liquid crystal display at 60 Hz or higher as mentioned above, as setting the frequency to 76 kHz or lower causes the frame rate of liquid crystal display to be 60 Hz or lower.

On the other hand, if a decrease in the 1H cycle by 1 µs does not result in the avoidance of external noise and cannot cause the capacitance to be equal to or less than a threshold value, the 1H period is set to 13.8 is by causing the 1H cycle to increase by 1 µs from the default value of 12.8 µs. FIG. 7 is a graph showing an example of a frequency distribution of external noise that is generated when the power source conversion device 4 (AC charger) is connected to the portable terminal device 1.

FIG. 7 shows that shifting the frequency of a driving signal of the touch panel 30 by approximately ±7% (approximately 10 kHz) makes it possible to avoid the peak frequency of external noise. This makes it possible to prevent erroneous detection of a touch position and therefore improve operability.

(Memory Section 52)

The host controller 50 stores, in a memory section (storage section) 52, a set value of a 1H period during which external noise was successfully avoided. In the configuration, storing an adjusted value (which was effective in reducing external noise) of the cycle or duration of a 1H period in the memory section 52 in advance and calling up the adjusted value makes it possible to, after the adjusted value has been stored in the memory section 52, shorten the duration of a process for avoiding external noise and the duration of touch panel sensitivity degradation, thus making it possible to shorten touch detection time, i.e. to improve the operability of the touch panel 30.

(Details of the Flow of a Process for Reducing External Noise)

Figure 6:
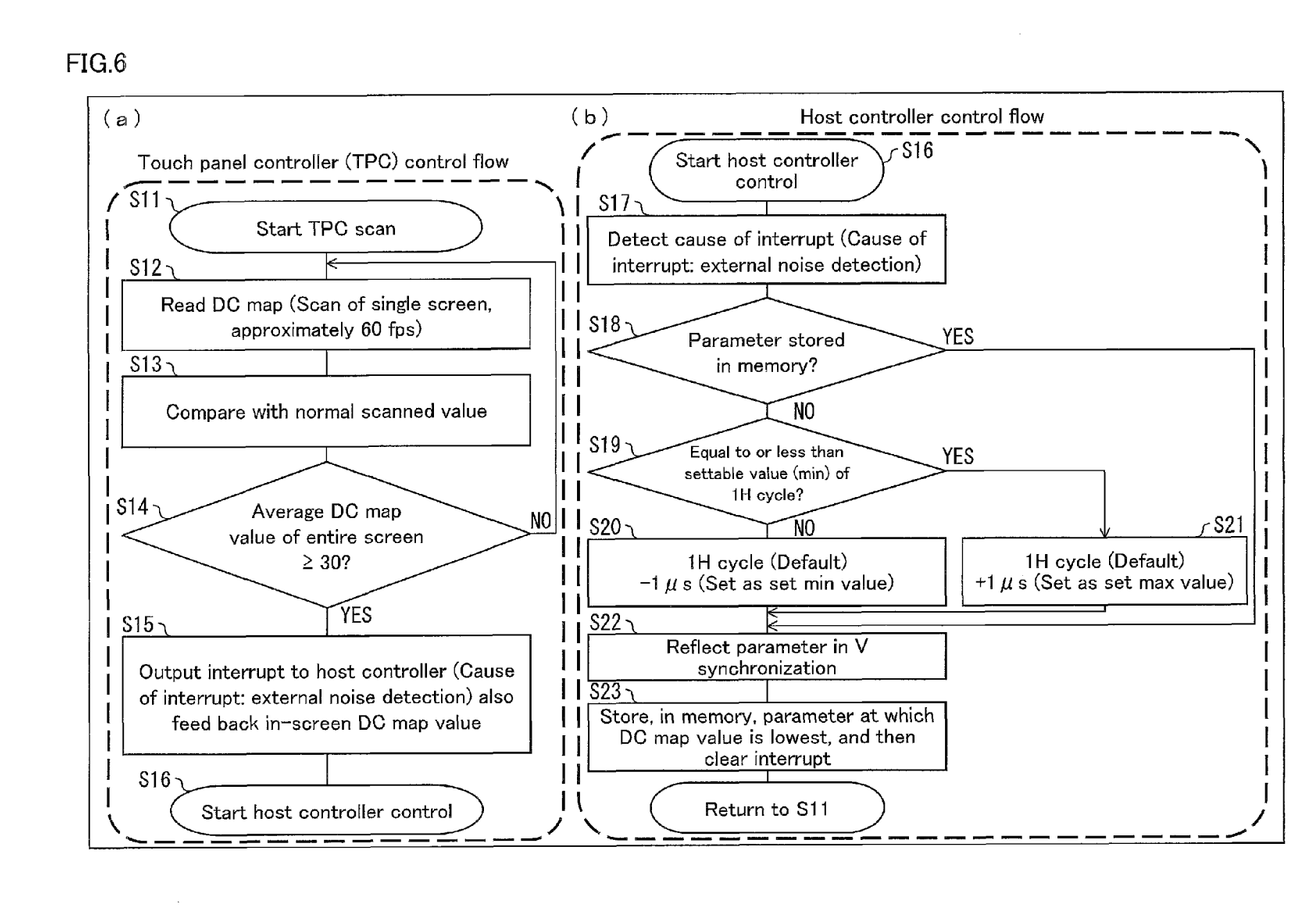
FIG. 6 is a set of flow charts (a) and (b) for explaining the flow of the process for reducing external noise, (a) showing the flow of control on the side of the touch panel controller, (b) showing the flow of control on the side of a host controller.

Next, the flow of the process for reducing external noise (method for driving a touch panel) is described with reference to FIG. 6. FIG. 6 is a set of flow charts (a) and (b) for explaining the flow of the process for reducing external noise.

First, (a) of FIG. 6 shows the flow of control on the side of the touch panel controller 40.

In step S11 (the word "step" being hereinafter omitted), the input operation detection section 42 of the touch panel controller 40 starts scanning (detecting) a plurality capacitances (output signals) at TP sensor intersections in numerical form. Then, the process proceeds to S12. It should be noted that touch panel controller 40 checks capacitances at the TP sensor intersections in numerical form every frame.

In S12 (signal detecting step), the input operation detection section 42 scans (detects) the DC map value of the entire screen of the touch panel 30 (60 fps; frames per second). Then, the process proceeds to S13.

In S13, the noise detection section 43 compares the DC-map value with normal scanned data (predetermined threshold value=average of DC map values=30). Then, the process proceeds to S14.

In S14, if the average of DC map values of the entire screen is 30 or greater, the noise detection section 43 determines that the presence of external noise has been confirmed, and notifies the interrupt control section 44 accordingly. Then, the process proceeds to S15 (YES; noise detecting step). On the other hand, if the average of DC map values of the entire screen is less than 30, the noise detection section 43 determines that external noise is not present, and the process returns to S11 (NO). This is based on the fact that interference between the driving frequency of the touch panel 30 and the frequency of AC charger noise caused by the power source conversion device 4 tends to cause the capacitance in the entire screen of the touch panel 30 to be higher than normal.

In S15, the interrupt control section 44 receives notification of the confirmation of the presence of external noise (notification of external noise detection), and transmits an interrupt signal (cause of interrupt: external noise detection or liquid crystal frequency change) to the host controller 50.

Then, the process proceeds to S16. At this time, an in-screen DC map value is also fed back.

Next, (b) of FIG. 6 shows the flow of control on the side of the host controller 50.

The process proceeds from S16 to S17. In S17, the host controller 50 receives (detects) the interrupt signal (cause of interrupt; external noise detection or liquid crystal frequency change). Then, the process proceeds to S18.

In S18, the liquid crystal drive parameter setting section 51 confirms whether or not a noise reduction parameter (i.e. an adjusted value of cycle or duration of a 1H period during which an effect of reducing external noise was brought about: hereinafter referred to simply as "parameter") is stored in the memory section 52. When the parameter is stored, the process proceeds to S22 (YES).

On the other hand, when the parameter is not stored in the memory section 52, the process proceeds to S19.

In S19, in order to change the touch panel driving frequency, the host controller 50 extends or shortens the "frequency of the 1H period", i.e. the liquid crystal drive parameter. More specifically, the liquid crystal drive parameter setting section 51 finds a value obtained by subtracting 1 μs from the cycle (default) of the 1H period or a value obtained by adding 1 μs to the cycle of the 1H period. Then, the liquid crystal drive parameter setting section 51 confirms whether or not the value obtained by subtracting 1 μs from the cycle of the 1H period is equal to or less than a set MIN value. If the value obtained by subtracting 1 μs from the cycle of the 1H period is equal to or less than the set MIN value, the process proceeds to S21. On the other hand, if the value obtained by subtracting 1 μs from the cycle of the 1H period is greater than the set MIN value, the process proceeds to S20. Since an extension of the 1H period may cause the frame rate to be equal to or lower than 60 Hz, it is preferable that the parameter be initially set so that the 1H period is shortened.

In S20, the liquid crystal drive parameter setting section 51 chooses, from among values of the liquid crystal parameter, the value obtained by subtracting 1 μs from the cycle of the 1H period and sets the value as a new 1H period. Then, the process proceeds to S22.

On the other hand, in S21, the value obtained by adding 1 μs to the cycle of the 1H period is set as a new 1H period. Then, the process proceeds to S22.

In S22 (noise reducing step), the host controller 50 sets the parameter (i.e. the new 1H period) in V synchronization and notifies the touch panel driving section 41 of the touch panel controller 40, and the touch panel driving section 41 drives the touch panel 30. Then, the process proceeds to S23.

In S23, in a case where the input operation detection section 42 obtains the DC map value and the new 1H period is more effective in reducing external noise than the 1H period already stored in memory section 52, the new 1H period, which is most effective in reducing external noise, is stored in the memory section 52 and the interrupt processing is cleared. Then, the process returns to S11. Hence, the next time the touch panel 30 receives external noise, the process from S19 to S21 for finding a value of the liquid crystal drive parameter at which there is little external noise can be omitted by calling up the liquid crystal drive parameter stored in the memory section 52.

(Regarding a Specific Set Value of a 1H Period)

An example of a case where the frequency is shifted by ±8.5% (6.6 kHz) is described. Let it be assumed that by default, the 1H cycle is 78.4 kHz (1H period=12.8 μs).

First, since, with 76 kHz or lower, the driving frequency of the touch panel 30 becomes equal to or lower than 60 Hz, the frequency is shifted toward a shorter 1H cycle (assuming that the set limit value is ±1 μs).

Since 1H period (default)−1 μs=11.8 μs (84.8 kHz), the driving frequency of the touch panel 30 shifts by 8.5% (6.6 kHz).

On the other hand, AC charger noise was not successfully avoided by shifting the frequency toward a shorter 1H cycle, the frequency is shifted toward a longer 1H period.

Since 1H period (default)+1 μs=13.8 μs (72.5 kHz), the driving frequency of the touch panel 30 shifts by 8.5% (6.6 kHz).

The foregoing example has dealt with a case where the liquid crystal drive parameter setting section 51 shift the frequency of a 1H period by ±8.5% at a time. However, how to shift the frequency is not limited to this example. For example, the liquid crystal drive parameter setting section 51 may be configured to shift the frequency by an absolute value of 1.7% incrementally, e.g. by ±1.7%, ±3.4%, ±5.1%, ±6.8%, and ±8.5% in sequence, and choose, from among the set values thus obtained, a value at which the lowest DC map value is obtained (i.e. a value at which external noise is most effectively reduced).

This configuration makes it possible to prevent degradation in touch panel sensitivity in the case of interference between the frequency of AC charger noise and the touch panel driving frequency in a state where liquid crystal driving and touch panel driving are synchronized with each other.

This configuration also makes it possible to minimize the duration of touch panel sensitivity degradation that is caused the next time the same power source conversion device 4 charges the portable terminal device 1. In other words, this configuration makes it possible to shorten the duration of a search for the liquid crystal drive parameter (i.e. the frequency of the 1H period).

Software Implementation Example

Lastly, blocks of the touch panel controller 40 or the host controller 50 (particularly, the touch panel driving section 41, the input operation detection section 42, the noise detection section 43, the interrupt control section 44, and the liquid crystal drive parameter setting section 51) may be realized by a logic circuit (hardware) provided in an integrated circuit (IC chip) or the like or may be realized by software as executed by a CPU (central processing unit).

In the latter case, the touch panel controller 40 or the host controller 50 includes a CPU and storage devices (storage media). The CPU executes instructions of a program realizing the foregoing functions. The storage devices include a ROM (read only memory) which contains the program, a RAM (random access memory) to which the program is loaded, and a memory containing the program and various types data. The object of the present invention can also be achieved by mounting to the touch panel controller 40 or the host controller 50 a computer-readable storage medium containing control program code (executable program, intermediate code program, or source program) for the touch panel controller 40 or the host controller 50, which is software realizing the aforementioned functions, in order for the computer (or CPU, MPU) to retrieve and execute the program code contained in the storage medium.

Usable examples of the storage media include: non-transitory tangible media), e.g., tapes such as magnetic tapes and cassette tapes, disks including magnetic disks such as floppy (Registered Trademark) disks and hard disks and optical disks such as CD-ROM/MO/MD/DVD/CD-R; cards such as IC cards (including memory cards) and optical cards, semiconductor memories such as mask ROM/EPROM/EEPROM (Registered Trademark)/flash ROM; logic circuits such as PLDs (programmable logic devices) and FPGAs (field programmable gate arrays); and the like.

The touch panel controller 40 or the host controller 50 may be arranged to be connectable to a communications network so that the program code may be delivered over the communications network. The communications network is not limited in any particular manner, and may be, for example, the Internet, an intranet, extranet, LAN, ISDN, VAN, CATV communications network, virtual dedicated network (virtual private network), telephone line network, mobile communications network, or satellite communications network. The transfer medium which makes up the communications network needs only be a medium over which the program code can be delivered, is not particularly limited in configuration or type, and may be, for example, wired line, such as IEEE1394, USB, electric power line, cable TV line, telephone line, or ADSL line; or wireless, such as infrared radiation (IrDA, remote control), Bluetooth (Registered Trademark), IEEE802.11 wireless, HDR (High Data Rate), NFC (Near Field Communication), DLNA (Digital Living Network Alliance) (Registered Trademark), mobile telephone network, satellite line, or terrestrial digital network. The present invention encompasses a carrier wave or data signal transmission in which the program code is embodied electronically.

Another Expression of the Present Invention

The present invention can also be expressed as follows: A touch panel driving device of the present invention may be a touch panel driving device including: a feeding section that supplies a power source to a display device; a driving section that drives a touch panel that is used in the display device; an input operation detection section that detects, in accordance with an output signal from the touch panel, an input operation performed on the touch panel; a noise reduction section that reduces an effect on the input operation detection section of noise generated from the feeding section; a noise detection section that identifies the magnitude and cycle of noise during feeding; and a noise reduction control section that controls, in accordance with the magnitude and cycle of noise detected by the noise detection section, a noise reduction method that is employed by the noise reduction section.

The foregoing configuration makes it possible to minimize the effect of external noise while eliminating noise caused by a display operation performed by the display device, thus making it possible to surely detect a touch signal.

Further, the touch panel driving device of the present invention may be configured such that: the noise reduction section identifies a cycle of noise that is detected by the noise detection section; and the driving section is controlled so that a certain amount or more of noise is not inputted at a timing when the input detection section detects an input.

Further, the touch panel driving device of the present invention may control an operating frequency.

Further, in controlling the driving section, the touch panel driving device of the present invention may control a liquid crystal drive setting parameter (cycle or duration of a horizontal synchronization period) as a way of controlling the operating frequency.

Further, in controlling the driving section, the touch panel driving device of the present invention may store the liquid crystal drive setting parameter in a memory to shorten an amount of time required for a noise reduction process and minimize the duration of touch panel sensitivity degradation.

Further, in controlling the driving section, the touch panel driving device of the present invention may store a remaining battery level of the feeding device in a memory to determine, in accordance with the remaining battery level, whether or not to control the liquid crystal drive setting parameter.

Further, a display device of the present invention is a display device including: a touch panel; and a touch panel driving device that drives the touch panel, the touch panel driving device being a touch panel driving device of any of the above configurations.

Further, the display device of the present invention may be a liquid crystal display device.

A touch panel driving device according to an aspect of the present invention includes: a drive control section that controls driving of a touch panel by transmitting a driving signal; a signal detection section that detects a plurality of output signals that are outputted from coordinates of the touch panel, respectively; a noise detection section that detects, in accordance with the magnitude of at least one of the plurality of output signals detected by the signal detection section, the presence or absence of at least external noise of an input operation performed on the touch panel; and a noise reduction section that, in a case where the presence of external noise has been detected by the noise detection section, executes a process for reducing the external noise by adjusting a cycle or duration of a horizontal synchronization period of the driving signal.

A touch panel driving method according to an aspect of the present invention is a touch panel driving method for controlling driving of a touch panel by transmitting a driving signal, including: a signal detecting step of detecting a plurality of output signals that are outputted from coordinates of the touch panel, respectively; a noise detecting step of detecting, in accordance with the magnitude of at least one of the plurality of output signals detected in the signal detecting step, the presence or absence of at least external noise of an input operation performed on the touch panel; and a noise reducing step of, in a case where the presence of external noise has been detected in the noise detecting step, executing a process for reducing the external noise by adjusting a cycle or duration of a horizontal synchronization period of the driving signal.

The present inventors discovered that the magnitude of at least one of the plurality of output signals that are under the influence of external noise (at least one of the plurality of output signals being hereinafter referred to simply as "output signal") tends to be greater than that of a normal output signal that is free of the influence of external noise. That is, if the magnitude of an output signal detected is greater than that of a normal output signal, it is highly likely that the output signal detected is under the influence of external noise, and if the magnitude of an output signal detected is as great as that of a normal output signal, it is highly likely that the output signal detected is free of the influence of external noise. Therefore, the presence or absence of external noise can be detected by detecting the magnitude of an output signal.

For this reason, by the noise detection section of the the foregoing configuration or in the noise detecting step of the foregoing method, the presence or absence of at least external noise of an input operation performed on the touch panel is detected in accordance with the magnitude of at least one of the plurality of output signals detected by the signal detection section or in the signal detecting step.

There are two possible cases of "in accordance with the magnitude of at least one of the plurality of output signals", namely "in accordance with one output signal" and "in accordance with two or more output signals". A possible example of the case "in accordance with one output signal" is a case where the median of the plurality of output signals is calculated. On the other hand, a possible example of the case "in accordance with a plurality of output signals" is a case where the average value or deviation value of the plurality of output signals is calculated.

Further, the "presence or absence of external noise" can be determined, for example, depending on whether or not a value such as the median, the average value, or the deviation value exceeds a predetermined threshold value. It should be noted that the value such as the median, the average value, or the deviation value is utilized to avoid erroneous detection.

Even in such a case where the frequency of external noise interferes with the frequency of a horizontal synchronization period (hereinafter referred to simply as "1H period") of a driving signal of the touch panel, adjusting the cycle or duration of the horizontal synchronization period of the driving signal makes it possible to suppress the interference of cycle between external noise and the 1H period (more specifically, to avoid the peak frequency of external noise), thus making it possible to reduce external noise.

For this reason, the foregoing configuration or method is configured such that in a case where the presence of external noise has been detected by the noise detection section or in the noise detecting step, a process for reducing the external noise by adjusting a cycle or duration of a horizontal synchronization period of the driving signal is executed. This makes it possible to surely detect a touch signal even in a case where a cycle of external noise interferes with a cycle of a 1H period.

Further, in addition to the foregoing configuration, the touch panel driving device according to an aspect of the present invention may be configured to further include an interrupt control section that, in a case where the presence of external noise has been detected by the noise detection section, transmits to the noise reduction section an interrupt signal indicating that the presence of external noise has been detected, wherein upon receiving the interrupt signal from the interrupt control section, the noise reduction section executes the process for reducing the external noise.

This configuration makes it possible to separately provide a section that executes a process for reducing external noise (e.g. the host controller) and a section that detects external noise (e.g. the touch panel controller), thus making it possible, for example, to reduce the information processing cost and device cost on the touch panel controller as compared with a case where the touch panel controller is provided with both the section that executes a process for reducing external noise and the section that detects external noise.

Further, in addition to the foregoing configuration, the touch panel driving device according to an aspect of the present invention may be configured such that: the noise detection section identifies a cycle of the external noise; and in accordance with the cycle of the external noise as identified by the noise detection section, the noise reduction section adjusts the cycle or duration of the horizontal synchronization period of the driving signal so that a predetermined amount or more of external noise is not inputted when the signal detection section detects the plurality of output signals.

This configuration will not greatly change the cycle or duration of the 1H period more than necessary. Therefore, this configuration makes it possible, for example, to avoid a situation where a change in the cycle or duration of the 1H period causes the frame rate of display to be less than 60 Hz.

Further, in addition to the foregoing configuration, the touch panel driving device according to an aspect of the present invention may be configured to further include a storage section in which the cycle or duration of the horizontal synchronization period as adjusted by the noise reduction section when the process for reducing the external noise was executed is stored.

In the foregoing configuration, storing an adjusted value of the cycle or duration of a 1H period in the memory section in advance and calling up the adjusted value makes it possible to, after the adjusted value has been stored in the memory section, shorten the duration of a process for avoiding external noise and the duration of touch panel sensitivity degradation, thus making it possible to shorten touch detection time, i.e. to improve the operability of the touch panel.

Further, in addition to the foregoing configurations, a display device according to an aspect of the present invention includes: a touch panel driving device of any one of the above configurations; and the touch panel.

The foregoing configuration makes it possible to achieve a display device that can surely detect a touch signal even in a case where a cycle of external noise interferes with a cycle of a 1H period.

Further, in addition to the foregoing, configuration, a display device according to an aspect of the present invention may be a liquid crystal display device.

In addition to the foregoing configuration, a portable terminal according to an aspect of the present invention may include: a touch panel driving device including the interrupt control section; the touch panel; and a feeding section that supplies a power source to a display device including the touch panel driving device and the touch panel, the interrupt control section determining, in accordance with a remaining amount of electricity that the feeding section is able to feed, whether or not to transmit the interrupt signal to the noise reduction section.

The foregoing configuration makes it possible for example to, in a case where the remaining amount of electricity that the feeding section can feed is small, cause the interrupt control section not to transmit an interrupt signal to the noise reduction section, thus making it possible to reduce power consumption and therefore extend the length of time for which the portable terminal can operate.

Further, the feed circuit operates, for example, at a constant current when the remaining amount of electricity that can be fed (i.e. the remaining battery level) becomes smaller. Since the switching (SW) frequency of the power source circuit is constant in a constant current state, the way spurious noise appears (for example, as shown in FIG. 7) hardly changes.

Each of the sections of the touch panel driving device and each of the steps of the touch panel driving method may be realized by a computer. In this case, a touch panel driver program for realizing the touch panel driving device and the touch panel driving method on a computer by causing the computer to operate as each of the sections and by causing the computer to execute each of the steps and a computer-readable storage medium containing the program are encompassed in the scope of the present invention.

[Additional Statement]

The present invention is not limited to the description of the embodiments above, but may be altered by a skilled person within the scope of the claims. An embodiment based on a proper combination of technical means disclosed in different embodiments is encompassed in the technical scope of the present invention. Furthermore, a new technical feature can be formed by a combination of technical means disclosed in different embodiments.

INDUSTRIAL APPLICABILITY

The present invention is applicable to a display device having a touch panel incorporated therein and to a portable terminal including such a display device. Specific examples of a display device to which the present invention is applicable include: an active-matrix liquid crystal display device; an electrophoretic display; a twisted-ball display; a reflective display employing a fine prism film; a display employing a light modulation device such as a digital mirror device; a display employing, as a light-emitting element, an element (such as an organic EL light-emitting element, an inorganic EL light-emitting element, or an LED (light-emitting diode) whose emission luminance is variable; a field emission display (FED); and a plasma display.

REFERENCE SIGNS LIST

1 Portable terminal device (portable terminal)
2 Liquid crystal display device (display device)
3 Feeding device
4 Power source conversion device
10 Liquid crystal module
11 Liquid crystal panel
12 Liquid crystal driver
20 Liquid crystal controller
30 Touch panel
40 Touch panel controller (touch panel driving device)
41 Touch panel driving section (drive control section)
42 Input operation detection section (signal detection section)
42a Sampling section
42b Touch position calculation section
43 Noise detection section (noise detection section)
44 Interrupt control section (interrupt control section)
50 Host controller
51 Liquid crystal drive parameter setting section (noise reduction section)
52 Memory section (storage section)
C11 to Cxy Capacitor
R1 to Ry Sense line
T1 to Tx Drive line

The invention claimed is:

1. A touch panel driving device comprising:
a drive control section that controls driving of a touch panel by transmitting a driving signal;
a signal detection section that detects a plurality of output signals that are outputted from coordinates of the touch panel, respectively;
a noise detection section that detects, in accordance with the magnitude of at least one of the plurality of output signals detected by the signal detection section, the presence or absence of at least external noise of an input operation performed on the touch panel;
a noise reduction section that, in a case where the presence of external noise has been detected by the noise detection section, executes a process of reducing the external noise by adjusting a cycle of a horizontal synchronization period of the driving signal; and
an interrupt control section that, in a case where the presence of external noise has been detected by the noise detection section, transmits to the noise reduction section an interrupt signal indicating that the presence of external noise has been detected; wherein
the drive control section controls the driving of the touch panel to be synchronized with driving of liquid crystals of a liquid crystal display;
the noise reduction section adjusts the cycle of the horizontal synchronization period of the driving signal by changing (i) a driving period of the liquid crystal display, and (ii) a driving period of the touch panel;
upon receiving the interrupt signal from the interrupt control section, the noise reduction section executes the process of reducing the external noise; and
the interrupt control section determines, in accordance with a remaining amount of electricity that a feeding section that supplies a power source is able to feed, whether or not to transmit the interrupt signal to the noise reduction section.

2. The touch panel driving device as set forth in claim 1, wherein:
the noise detection section identifies a cycle of the external noise; and
in accordance with the cycle of the external noise as identified by the noise detection section, the noise reduction section adjusts the cycle of the horizontal synchronization period of the driving signal so that a predetermined amount or more of external noise is not inputted when the signal detection section detects the plurality of output signals.

3. The touch panel driving device as set forth in claim 1, further comprising a storage section in which the cycle of the horizontal synchronization period as adjusted by the noise reduction section when the process for reducing the external noise was executed is stored.

4. A display device comprising:
a touch panel driving device as set forth in claim 1; and
the touch panel.

5. The display device as set forth in claim 4, wherein the display device is a liquid crystal display device that includes the liquid crystal display.

6. A non-transitory computer-readable storage medium containing a touch panel drive program for causing a computer to operate as each of the sections of a touch panel driving device as set forth in claim 1.

7. A touch panel driving method for controlling driving of a touch panel by transmitting a driving signal, comprising:
a signal detecting step of detecting a plurality of output signals that are outputted from coordinates of the touch panel, respectively;
a noise detecting step of detecting, in accordance with the magnitude of at least one of the plurality of output signals detected in the signal detecting step, the presence or absence of at least external noise of an input operation performed on the touch panel;
a noise reducing step of, in a case where the presence of external noise has been detected in the noise detecting step, executing a process of reducing the external noise by adjusting a cycle of a horizontal synchronization period of the driving signal; and
an interrupt control step of, in a case where the presence of external noise has been detected by the noise detecting step, generating and transmitting an interrupt signal indicating that the presence of external noise has been detected; wherein the driving of the touch panel is synchronized with driving of liquid crystals of a liquid crystal display;

in the noise reducing step, the cycle of the horizontal synchronization period of the driving signal is adjusted by changing (i) a driving period of the liquid crystal display, and (ii) a driving period of the touch panel;

In response to the interrupt signal generated in the interrupt control step, the noise reducing step executes the process of reducing the external noise; and the interrupt control step further includes a process of determining, in accordance with a remaining amount of electricity that is able to be fed, whether or not to transmit the interrupt signal.

\* \* \* \* \*